US005198958A

United States Patent [19]

Krantz, Jr.

[11] Patent Number: 5,198,958

[45] Date of Patent: Mar. 30, 1993

[54] TRANSIENT SUPPRESSION COMPONENT

[75] Inventor: Leonard A. Krantz, Jr., Sidney, N.Y.

[73] Assignee: Amphenol Corporation, Wallingford, Conn.

[21] Appl. No.: 709,152

[22] Filed: Jun. 3, 1991

[51] Int. Cl.[5] .................................... H03H 7/00

[52] U.S. Cl. .................................... 361/119; 361/56; 361/111; 439/608; 439/620

[58] Field of Search .................... 361/119, 56, 111, 118; 439/620, 608

[56] References Cited

U.S. PATENT DOCUMENTS

| | | | |
|---|---|---|---|
| 3,001,110 | 9/1961 | Frazier | 317/234 |
| 3,274,456 | 9/1966 | Pittler et al. | 317/234 |
| 3,343,107 | 9/1967 | Golightly | 333/84 |
| 3,412,788 | 11/1968 | Pomerantz | 165/185 |
| 3,424,852 | 1/1969 | Hauck et al. | 174/17.05 |
| 3,428,871 | 2/1969 | Scott et al. | 317/234 |
| 3,439,238 | 4/1969 | Birchler et al. | 317/235 |
| 3,566,003 | 2/1971 | Wislocky | 174/52 |
| 3,598,896 | 8/1971 | Hassler | 174/52 |
| 3,846,823 | 11/1974 | Matthews et al. | 357/74 |
| 3,946,416 | 3/1976 | Hacskaylo | 357/17 |
| 4,157,486 | 6/1979 | Fegley | 315/72 |
| 4,572,600 | 2/1986 | Nieman | 339/14 |
| 4,582,385 | 4/1986 | Couper et al. | 339/147 |
| 4,583,810 | 4/1986 | Gliha, Jr. | 439/620 |
| 4,600,262 | 7/1986 | Nieman et al. | 339/147 |
| 4,707,049 | 11/1987 | Gliha | 439/620 |
| 4,741,710 | 5/1988 | Hogan et al. | 439/620 |
| 4,746,310 | 5/1988 | Krantz et al. | 439/620 |
| 4,747,789 | 5/1988 | Gliha | 439/620 |
| 4,952,173 | 8/1990 | Peronnet et al. | 439/620 |
| 4,954,794 | 9/1990 | Neiemah et al. | 439/620 |

*Primary Examiner*—A. D. Pellinen
*Assistant Examiner*—S. Jackson
*Attorney, Agent, or Firm*—Bacon & Thomas

[57] ABSTRACT

A transient suppression component includes a lead assembly adapted to permit in-line installation in a connector contact. One lead surrounds the other and is cylindrical for connection to the aperture tines of a connector ground plate. The other lead carries electrical signals between mating portions of the connector contact assembly. A transient suppression component body is connected between the feedthrough lead and the cylindrical ground lead.

28 Claims, 2 Drawing Sheets

TRANSIENT SUPPRESSION COMPONENT

BACKGROUND OF THE INVENTION

1. Field of the Invention

This invention relates to a transient suppression component, and in particular to a transient suppression component for use in an electrical connector.

2. Description of Related Art

It has previously been proposed to place diodes and other nuclear electromagnetic pulse (EMP) or transient voltage suppression (TVS) electrical components on electrical contacts for the purpose of facilitating their use in miniature electrical connectors. Examples are shown in U.S. Pat. Nos. 4,741,710, 4,746,310, and 4,747,789. Present technology, exemplified by the connectors shown in these patents, requires that the component be mounted to the contact by the connector assembler rather than by the component manufacturer.

Prior to insertion of the contact into the connector, the assembler must handle the component, complete the attachment of the component to the contact, and perform screen testing on the contact assembly which is over and above the screening performed by the component manufacturer. Such redundant testing is inefficient, as is the need to handle the component by both the manufacturer of the component and the connector assembler.

Assembly of the EMP or TVS component to the contact would best be handled by the manufacturer of the component, using state-of-the-art component electrode-to-metal joining technology not generally required in connector assembly plants. At present, however, this is not possible because conventional TVS connector designs provide only for retrofitting of the component onto the contact. In other words, at present it is necessary to first provide a contact designed and manufactured for a particular application, and then to add the electronic component.

In addition, present connector applications do not permit the use of higher power diodes because the center-to-center spacing of contacts in such connectors limits the use of conventional leaded diodes. Conventional leaded diode chips are mounted so that the surfaces of the silicon chip are perpendicular to the leads. Consequently, when higher power diodes are needed, the silicon diameter becomes larger than the contact spacing.

SUMMARY OF THE INVENTION

In order to solve the above mentioned disadvantages of prior EMP or TVS contact structures, it is an objective of the invention to provide a TVS component package which is directly useable by the connector manufacturer in a connector without the need for assembly of the TVS component to the contact.

It is a further objective of the invention to provide a TVS component manufactured using standard state-of-the-art technology generally employed by the semiconductor industry, and which may be connected to a variety of different connector contact structures using standard metal-to-metal assembly techniques.

It is a still further objective of the invention to provide a discrete electrical component such as a diode adapted for use in an electrical connector and which can be replaced for purposes of repair or circuit enhancement without removing the connector from the application.

It is yet another objective of the invention to permit the use of higher power diodes in connector applications by mounting the silicon chip transversely in respect to the longitudinal axis of the diode leads so that the surface of the diode is parallel with the leads, enabling use of rectangular diodes and increasing the surface area of the diode by increasing the length of the diode which permits a greater power capability to be achieved without affecting the contact center-to-center spacing.

These objectives are achieved by providing a lead structure for an electrical component in which one lead, attached to either the component anode or cathode, has both an input and an output, and in which a second lead is provided which forms a ground sleeve adapted to directly contact a connector ground plate. The component package is sealed using epoxy or a hermetic glass seal and is ready for assembly into the connector. A single component design can therefore be provided which is ready for assembly onto a variety of contacts, without further processing necessary prior to assembly into the connector. In an especially advantageous embodiment of the invention, the leads are formed of stamped sheets of conductive material.

DETAILED DESCRIPTION OF THE PREFERRED EMBODIMENTS

Figure 2:
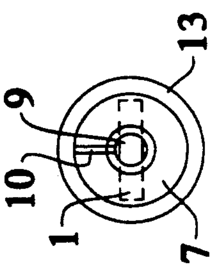
FIG. 2 is an elevated end view taken from the perspective of line 1—1 in FIG. 1.
Figure 1:
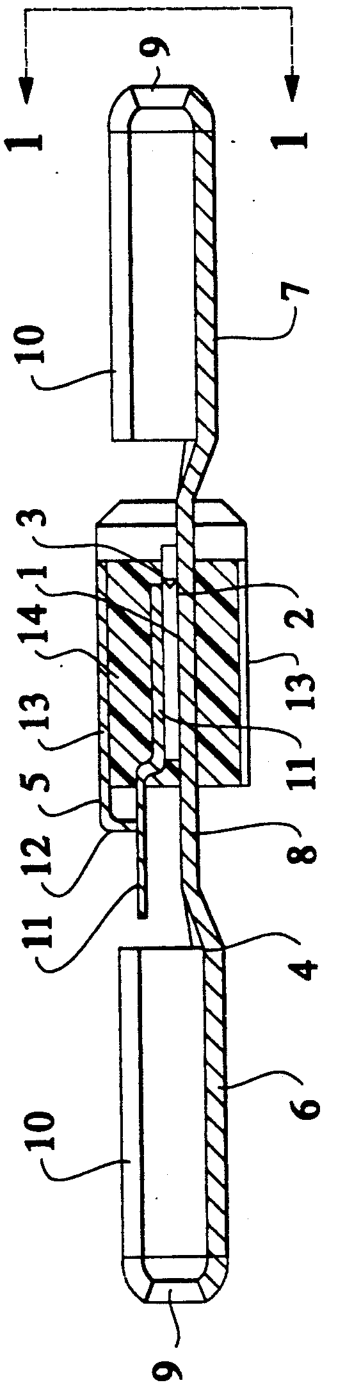
FIG. 1 is a cross-sectional side view of transient suppression component package according to a first preferred embodiment of the invention.

FIG. 1 is a cross-sectional side view of a transient suppression component package according to a first preferred embodiment of the invention, and FIG. 2 is an end elevation showing the component package of FIG. 1. The illustrated package includes a component body 1 in the form of a diode body and two electrodes 2 and 3, one of which forms a cathode and the other an anode of the diode. The preferred diode assembly also includes two unique component leads 4 and 5. It will of course be appreciated by those skilled in the art that component elements other than diode bodies may advantageously be used with the unique leads of the invention.

For example, component body 1 may also take the form of a varistor body, and in particular a multilayer varistor (MLV). It will be appreciated by those skilled in the art that the lead structures described below may be modified to accommodate a wide variety of materials and manufacturing techniques, and that all such modifications are intended to be including within the scope of the invention.

Lead 4 includes a first end section 6, a second end section 7, and a main section 8. The three sections are preferably formed from a single stamped piece of a conductive material such as copper. In general, copper is too soft for use as a connector contact, but for purposes in which the material is not subjected to too great a mechanical or thermal stress, copper is preferred because of its greater compatibility with the material of the diode electrodes.

Electrode 2 of diode body 1 is directly connected to main section 8 of lead 4, which forms a flat surface to facilitate attachment of the lead to the diode. The two end sections 6 and 7 may, according to the first preferred embodiment of the invention, be folded to form cylindrical termination sections, including apertures 9, which add rigidity of the lead and permit easy "plug in" electrical connection of the lead to a variety of corresponding mating contact structures. The folding of the end sections to form a cylinder results in a gap 10, which may optionally be closed by welding or a suitable adhesive. Lead 4 provides a feedthrough path for carrying electrical signals from one mating contact structure to another, while at the same time providing an input path to electrode 2 of diode body 1.

On the other hand, the second lead 5 provides a single electrical path in the form of a conductive sleeve in order to electrically connect the diode to the ground plate of an electrical connector. This lead includes three portions: a lead portion 11 connected to electrode 3, an extension 12, and a cylindrical sleeve 13 surrounding the intermediate section 8 of lead 4.

Main section 8 of lead 4, diode body 1 and at least part of lead portion 11 of lead 5 are surrounded by a dielectric insulator or encapsulant 14 which holds each of the components in place and permits handling of the assembly, while sleeve 13 is arranged to surround insulator 14. For example, dielectric 14 may be in the form of a molded cylinder around which ground sleeve 13 is placed after molding. Alternatively, the diode body and leads may be hermetically sealed by a variety of known methods. Extension 12 of lead 5 is preferably stamped from the same sheet as conductive sleeve 13 and may be soldered to lead portion 11 to complete the package. In the case of a plastic encapsulant, portion 11 is preferably copper, but portions 12 and 13 may be made of a harder conductive material such as brass. On the other hand, if hermetic sealing of the component body 1 is used, the lead material should be an alloy able to withstand the higher temperatures involved, and which is nevertheless compatible with the diode body electrode metallization. An example of such a material is kovar, but numerous other suitable alloys may be substituted. Finally, as shown in FIG. 2, the diode body itself is preferably centered in respect to a principal axis of the package when the package is completed.

Figure 4:
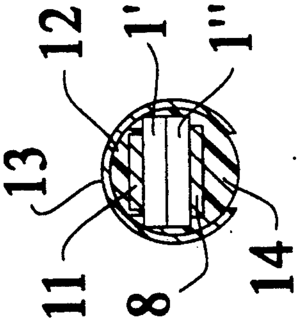
FIG. 4 is a cross-sectional end view taken along line 2—2 in FIG. 3.
Figure 3:
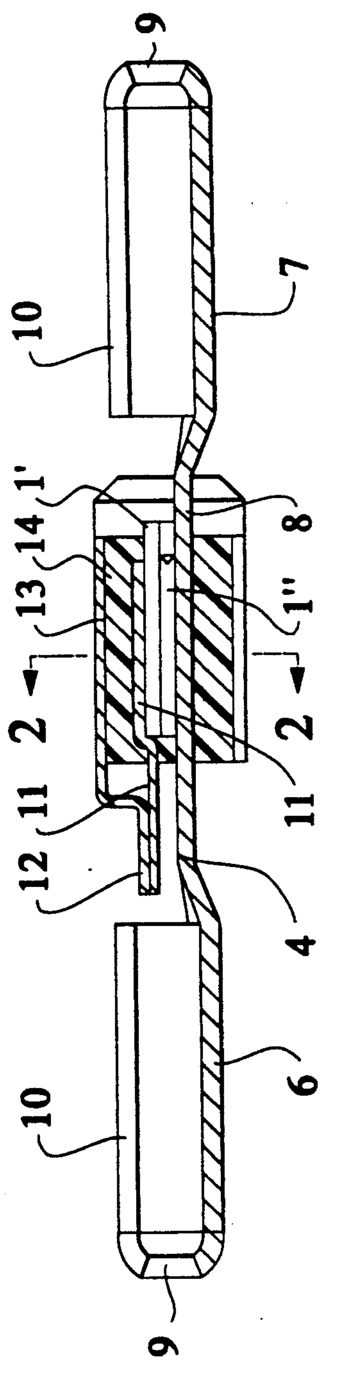
FIG. 3 is a cross-sectional side view showing a variation of the component package of FIG. 1.

The variation of the first preferred embodiment shown in FIGS. 3 and 4 is identical to that of FIG. 1, except that a second diode body in series with the first diode body has been added for the purpose of doubling power handling capacity. In an especially advantageous embodiment, the second component is a microwave diode or rectifier silicon material having the property of low capacitance. The addition of a relatively low capacitance component in series with diode body 1 decreases the total capacitance of the shunt circuit because the total capacitance is the reciprocal of the sum of the reciprocals of the individual capacitances of the components. As a result, distortion of signals carried by lead 4 may be significantly reduced.

Because the diode chip or chips are mounted transversely in respect to principal longitudinal axes of the diode leads so that the principal surfaces of the diode are parallel to those of the leads, the diode bodies or chips may be either circular or rectangular. The latter configuration permits the surface area of the diode to be increased by increasing the length of the diodes, thereby increasing power handling capability without affecting contact center-to-center spacing in connector applications.

Figure 5:
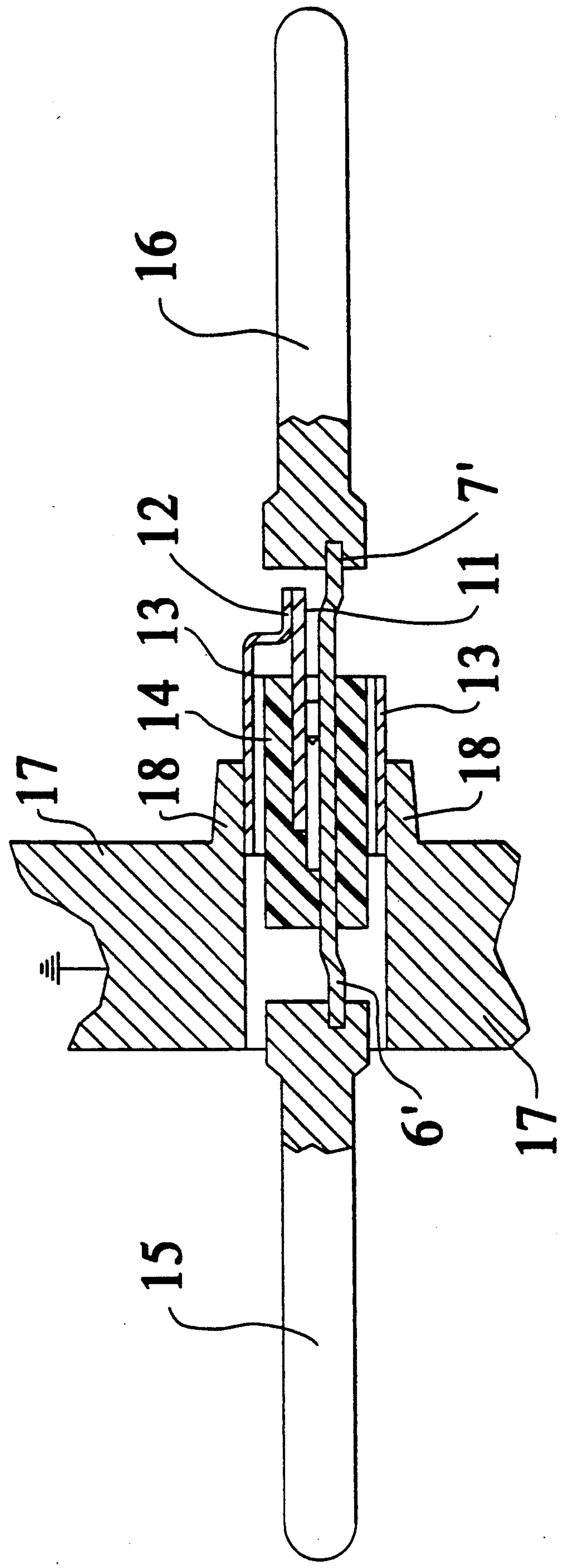
FIG. 5 is a side view of a TVS component package and connector contact assembly according to a second preferred embodiment of the invention.

An example of the manner in which a diode constructed according to the principles of the invention may be used in a connector or similar electrical device is shown in FIG. 5, which also shows a second preferred embodiment of the inventive component lead structure. The connector includes a ground plate 17, which is electrically connected to the shell of the connector (not shown). As disclosed in U.S. Pat. No. 4,747,789, for example, the ground plate includes resilient tines 18 extending from an aperture in the plate through which the contact passes. The tines engage lead 5 when the diode assembly is inserted into the connector.

Prior to insertion into the connector, the first diode lead 4 is attached to a pair of contact mating sections 15 and 16 made of a suitable conductive material such as brass. In this embodiment, the end sections 6′ and 7′ of the lead take the form of pin shape sections inserted and soldered or glued into bores in contact sections 15 and 16, but contact sections 15 and 16 may clearly also be provided with portions suitably shaped to engage apertures 9 of the cylindrical end sections 6 and 7 shown in FIGS. 1–4. Alternatively, end sections 6 and 7 or 6′ and 7′ may themselves be used as contact mating sections for corresponding connector contacts. Contact mating sections 15 and 16 may in general take any form necessary to permit mating of the connector to a corresponding second connector.

A variety of inserts are available for mechanically supporting contact sections 15 and 16 within the connector body. A significant advantage of the preferred arrangements as described above is that the diode itself essentially floats within the connector and is mechanically isolated from the contact pins. This permits discrete replacement of termination contacts 15 and 16 without the necessity of having to replace the diode itself.

Alternatively, the diode packages or units can be arranged to be removed from the connector in the manner disclosed in U.S. Pat. Nos. 4,746,310 and 4,789,360. In other words, the component package permits replacement or substitution of individual components within the connector, while at the same time protecting the individual components and permitting a contact termination section to be replaced if damaged without necessitating replacement of the component itself.

As described herein, therefore, the invention provides a SGEMP, EMP, or TVS component package in which one of the leads is adapted to be connected to connector contact mating portions having a variety of different configurations, and the other lead is adapted to engage the resilient tines located in apertures of a conventional connector ground plate for easy insertion into and removal from the connector. A single component package, including the unique lead configurations of the preferred embodiments, may be manufactured in bulk by the component manufacturer using state-of-the-art component manufacturing techniques, and assembled to any desired contact mating portion configuration using relatively simple metal-to-metal joining techniques. After the leads are assembled to the component and the component is tested, no further testing or special handling of the individual component body is required.

Having thus described specific embodiments of an improved component package and a contact assembly using the improved component package, it will of course be appreciated that the invention should not to be limited to the described embodiments. It is anticipated that numerous variations will occur to those skilled in the art, for example, the use of a multi-layered varistor body in place of the above-described diode body, and therefore it is intended that the invention be limited solely by the appended claims.

I claim:

1. An electrical component package, comprising:

a first lead having a first end section and a second end section, said first end section including means for mating said first lead with a first electrical contact positioned in an electrical connector, and said second end section including means for mating said second end section with a second electrical contact also positioned in said electrical connector, said first lead further comprising a main section including a component body mounting surface connecting said first and second end sections;

a component body mounted on one side of said main section; and a second lead electrically connected to said component body, said second lead substantially surrounding said main section and said body, and separated from said main section by an insulating medium.

2. A package as claimed in claim 1, wherein said first lead is formed from a single sheet of stamped and formed conductive material such that said main section is substantially planar and has two oppositely facing principal planar surfaces, said component body being mounted on one of said surfaces, and wherein at least one of said end sections forms a hollow cylinder.

3. A package as claimed in claim 1, wherein said first lead is formed from copper.

4. A package as claimed in claim 1, wherein said first lead is formed from an alloy material.

5. A package as claimed in claim 1, wherein the insulating material further comprises a molded insulating material surrounding said main section, said body, and a first portion of said second lead, and wherein a conductive sleeve portion of said lead substantially surrounds said insulating material and is electrically connected via an extension to said first portion of said second lead.

6. A package as claimed in claim 5, wherein said first portion is formed from copper.

7. A package as claimed in claim 1, wherein said main section, said body, and a first portion of said second lead are hermetically sealed, and wherein a conductive sleeve portion of said second lead substantially surrounds said hermetically sealed main section, body, and first portion, said sleeve portion being electrically connected via an extension to said first portion of said second lead.

8. A package as claimed in claim 7, wherein said first portion is formed from an alloy material.

9. A package as claimed in claim 1, wherein said component body includes a semiconductor.

10. A package as claimed in claim 9, wherein said component is a diode.

11. A package as claimed in claim 9, wherein said component body comprises two diode bodies connected in series.

12. A package as claimed in claim 11, wherein one of said two diode bodies is a low capacitance diode.

13. A package as claimed in claim 1, wherein said component body is a multilayer varistor chip.

14. A package as claimed in claim 1, wherein said component body includes a rectangular cross section having a length parallel to a principle longitudinal axis of said first lead, whereby a power handling capability of said component is determined according to said length.

15. A package as claimed in claim 1, wherein said body includes a first electrode which contacts said main section of said first lead, and a second electrode which contacts a portion of said second lead.

16. An electrical device having an electrical signal carrying contact structure, comprising discrete first and second electrical signal carrying contacts, and an in-line electrical component, said component including a component body; a first lead having a first end section connected to said first contact, a second end section connected to said second contact, and a main section including a mounting surface for attachment of said first lead to a first electrode of said component body; and a second lead which includes a conductive sleeve adapted to engage resilient tines extending from a ground plate in said connector, said component body being mounted on one side of said first lead.

17. A device as claimed in claim 16, wherein said first lead is formed from a single sheet of stamped and formed metallic material such that said main section has two oppositely facing principal planar surfaces, said component body being mounted on one of said surfaces, and wherein at least one of said end sections forms a hollow cylinder.

18. A device as claimed in claim 16, wherein said first lead is formed from copper.

19. A device as claimed in claim 16, wherein said first lead is formed from an alloy material.

20. A device as claimed in claim 16, further comprising a molded dielectric material surrounding said main section, said body, and a first portion of said second lead, and wherein said conductive sleeve portion of said second lead substantially surrounds said dielectric material and is electrically connected via an extension to said first portion of said second lead.

21. A device as claimed in claim 16, wherein said main section, said body, and a first portion of said second lead are hermetically sealed, and wherein a conductive sleeve portion of said second lead substantially surrounds said hermetically sealed main section, body, and first portion, said sleeve portion being electrically connected via an extension to said first portion of said second lead.

22. A device as claimed in claim 16, wherein said component is a diode.

23. A device as claimed in claim 16, wherein said component body comprises two diode bodies connected in series.

24. A device as claimed in claim 23, wherein one of said two diode bodies is a low capacitance diode.

25. A package as claimed in claim 16, wherein said component body is a multilayer varistor chip.

26. A package as claimed in claim 16, wherein said component body includes a rectangular cross section having a length parallel to a principal longitudinal axis of said first lead, whereby a power handling capability of said component is determined according to said length.

27. A device as claimed in claim 16, wherein said body includes a first electrode which contacts and is electrically connected to said main section of said first lead, and a second electrode electrically connected to said second lead.

28. An electrical component package, comprising:

a first lead having a first end section and a second end section, and a main section including a component body mounting surface connecting said first and second end sections;

a component body mounted on one side of said main section; and a second lead electrically connected to said component body, said second lead substantially surrounding said main section of said first lead, wherein said first lead is a single sheet of stamped and formed conductive material, at least one of said ends forming a hollow cylinder, and wherein said main section is flat and said component mounting surface is continuous with an inside surface of said hollow cylinder.

* * * * *